United States Patent
Li et al.

(10) Patent No.: US 10,204,927 B2
(45) Date of Patent: Feb. 12, 2019

(54) DISPLAY SUBSTRATE, DISPLAY DEVICE CONTAINING THE SAME, AND METHOD FOR FABRICATING THE SAME

(71) Applicants: BOE TECHNOLOGY GROUP CO., LTD, Beijing (CN); BEIJING BOE DISPLAY TECHNOLOGY CO., LTD., Beijing (CN)

(72) Inventors: Lin Li, Beijing (CN); Zhaohui Hao, Beijing (CN); Weidong Liu, Beijing (CN)

(73) Assignees: BOE TECHNOLOGY GROUP CO., LTD, Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/324,397

(22) PCT Filed: Jul. 1, 2016

(86) PCT No.: PCT/CN2016/088179
§ 371 (c)(1),
(2) Date: Jan. 6, 2017

(87) PCT Pub. No.: WO2017/071277
PCT Pub. Date: May 4, 2017

(65) Prior Publication Data
US 2017/0294449 A1 Oct. 12, 2017

(30) Foreign Application Priority Data
Oct. 30, 2015 (CN) .......................... 2015 1 0728689

(51) Int. Cl.
*H01L 27/12* (2006.01)
*H01L 27/32* (2006.01)
(Continued)

(52) U.S. Cl.
CPC ........ *H01L 27/124* (2013.01); *H01L 27/1262* (2013.01)

(58) Field of Classification Search
CPC ........................... H01L 27/12–27/1255; H01L 27/127–27/1285;
(Continued)

(56) References Cited

U.S. PATENT DOCUMENTS 5,414,283 A * 5/1995 den Boer .............. G02F 1/1368
257/59
7,115,902 B1 10/2006 Yamazaki
(Continued)

FOREIGN PATENT DOCUMENTS

| CN | 101770125 A | 7/2010 |
| CN | 102931211 A | 2/2013 |

(Continued)

OTHER PUBLICATIONS

The World Intellectual property Organization (WIPO) International Search Report for PCT/CN2016/088179 dated Oct. 10, 2016 pp. 1-13.
(Continued)

*Primary Examiner* — Natalia A Gondarenko
(74) *Attorney, Agent, or Firm* — Anova Law Group, PLLC (57) ABSTRACT

The present disclosure provides a display substrate, including: a wiring mounting region. The wiring mounting region includes first wires and second wires, each of the first wires intersecting with one or more of the second wires, thereby defining one or more intersectional regions; and a semiconductor pattern between the first wire and the one or more second wires, the semiconductor pattern having at least one cross-sectional width covering at least a portion of at least one of the intersectional regions.

18 Claims, 7 Drawing Sheets

(51) Int. Cl.
*H01L 29/786* (2006.01)
*H01L 29/66* (2006.01)

(58) Field of Classification Search
CPC .......... H01L 27/1259–27/1296; H01L 29/458;
H01L 29/41733; H01L 29/4908; H01L
29/42384–29/42392; H01L 29/786; H01L
21/84; H01L 2021/775; H01L
2029/42388; H01L 27/32–27/3276; G02F
1/1343; G02F 1/1368; G02F 1/136; G02F
1/13685
USPC ............... 257/72, 57, 59, 347, 401; 438/149
See application file for complete search history.

(56) References Cited

U.S. PATENT DOCUMENTS

| | | | | |
|---|---|---|---|---|
| 7,928,437 | B2* | 4/2011 | Shin | H01L 27/0248 257/59 |
| 9,324,972 | B2 | 4/2016 | Yang et al. | |
| 9,349,751 | B2* | 5/2016 | Yamazaki | H01L 27/1225 |
| 2005/0056847 | A1* | 3/2005 | Nakamura | H01L 27/016 257/72 |
| 2011/0042666 | A1 | 2/2011 | Yang et al. | |
| 2013/0037818 | A1 | 2/2013 | Lee et al. | |
| 2013/0140554 | A1* | 6/2013 | Yamazaki | H01L 29/786 257/43 |
| 2016/0013217 | A1* | 1/2016 | Huang | H01L 27/1248 257/59 |

FOREIGN PATENT DOCUMENTS

| | | |
|---|---|---|
| CN | 104659056 A | 5/2015 |
| CN | 105226071 A | 1/2016 |
| CN | 205039154 U | 2/2016 |

OTHER PUBLICATIONS

State Intellectual Property Office of the P.R.C (SIPO) Office Action 1 for 201510728689.4 dated Aug. 21, 2017 14 Pages (including translation).

* cited by examiner

DISPLAY SUBSTRATE, DISPLAY DEVICE CONTAINING THE SAME, AND METHOD FOR FABRICATING THE SAME

CROSS-REFERENCES TO RELATED APPLICATIONS

This patent application is a national phase entry under 35 U.S.C. § 371 of International Application No. PCT/CN2016/088179, filed on Jun. 1, 2016, which claims priority to Chinese Patent Application No. 201510728689.4, filed on Oct. 30, 2015. The above enumerated patent applications are incorporated by reference herein in their entirety.

TECHNICAL FIELD

The present invention generally relates to the display technologies and, more particularly, relates to a display substrate, a display device containing the display substrate, and a method for fabricating the display substrate.

BACKGROUND

Figure 1:
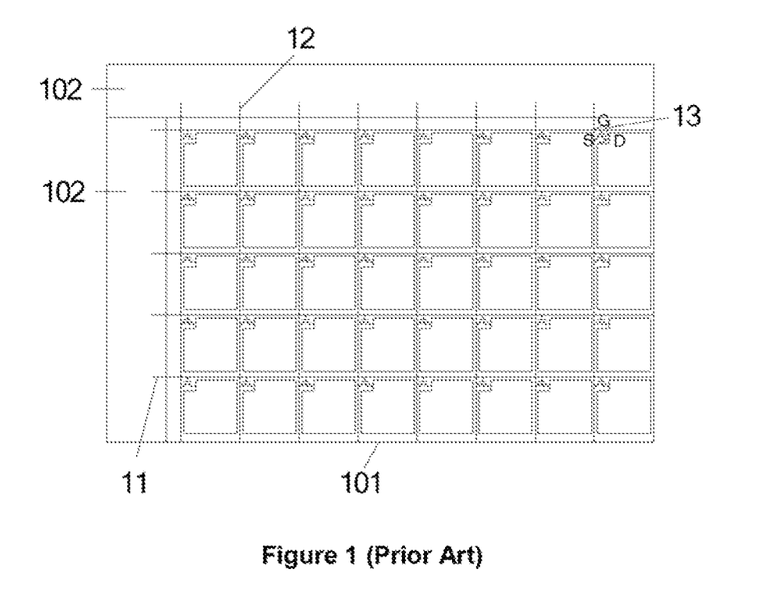
FIG. 1 illustrates a top view of a conventional display panel.

A top view of a conventional display panel is shown in FIG. 1. The conventional display panel often includes a display region 101 and a wiring mounting region 102. The display region 101 includes a plurality of display units defined by intersecting gate lines 11 and data lines 12. Each display unit includes or corresponds to a thin-film transistor (TFT) 13. A TFT 13 includes a gate electrode G, a source electrode S, and a drain electrode D. The gate electrode G is connected to a gate line 11. The source electrode S is connected to a data line 12. When electrical signals are applied on the gate line 11 and the data line 12 at the same time, the TFT 13 is turned on to control a corresponding display unit to display at a different gray level. The wiring mounting region 102 may use a flexible printed circuit board (PFC) to output control signals to the gate lines 11 and the data lines 12.

Figure 2:
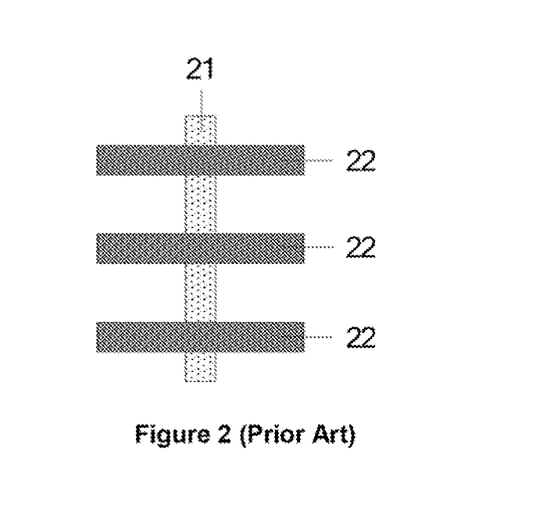
FIG. 2 illustrates a top view of a portion of a wiring mounting region of a conventional display panel.

The wiring mounting region often includes an immense amount of wirings, which can result in an undesirably number of crossings and intersectional regions between wires. For example, as shown in FIG. 2, a first wire 21 may intersect with three second wires 22. As a result, capacitance is formed at the intersectional region of the first wire 21 and a second wire 22. The capacitance can adversely affect signal transmission in these wires.

BRIEF SUMMARY

Embodiments of the present disclosure provide a display substrate, a method for fabricating the display substrate, and a semiconductor device incorporating the display substrate. In the disclosed display substrate, a semiconductor pattern is disposed between a first wire and a number of second wire for reducing the capacitance in between.

One aspect of the present disclosure includes a display substrate, including: a wiring mounting region. The wiring mounting region includes first wires and second wires, each of the first wires intersecting with one or more of the second wires, thereby defining one or more intersectional regions; and a semiconductor pattern between the first wire and the one or more second wires, the semiconductor pattern having at least one cross-sectional width covering at least a portion of at least one of the intersectional regions.

Optionally, the semiconductor pattern has a circular shape or an oval shape.

Optionally, the semiconductor pattern is between the first wire and each of the one or more second wires.

Optionally, the semiconductor pattern is between the first wire and a number of second wires.

Optionally, along a direction the second wires are aligned, a cross-sectional width of the semiconductor pattern extends beyond a cross-sectional width of the first wire.

Optionally, along a direction the first wires are aligned, a cross-sectional width of the semiconductor pattern extends beyond a cross-sectional width of the second wire.

Optionally, along a direction the second wires are aligned, the cross-sectional width of the semiconductor pattern is smaller than a cross-sectional width of the first wire.

Optionally, along a direction the first wires are aligned, the cross-sectional width of the semiconductor pattern is smaller than a cross-sectional width of the second wire.

Optionally, the display substrate further includes a display region surrounded by the wiring mounting region.

Optionally, the display substrate further includes: a first conductive layer, a second conductive layer, an insulating layer between the first conductive layer and the second conductive layer, and a semiconductor layer between the first conductive layer and the second conductive layer. The first conductive layer includes the first wires in the wiring mounting region, the second conductive layer includes the second wires in the wiring mounting region, and the semiconductor layer includes the semiconductor pattern in the wiring mounting region.

Optionally, the semiconductor pattern is between the insulating layer and the second conductive layer.

Optionally, the first conductive layer further includes gate lines in the display region; the second conductive layer further includes data lines in the display region; and the semiconductor layer further includes active layers in the display region.

Another aspect of the present disclosure provides a method for forming a display substrate. The method includes forming a first conductive layer on a substrate, the first conductive layer including first wires disposed in a wiring mounting region of the substrate; forming an insulating layer on the substrate, the insulating layer covering the first wires in the wiring mounting region; forming a semiconductor layer on the substrate, the semiconductor layer including semiconductor patterns disposed in the wiring mounting region, and each semiconductor pattern overlapping with at least one first wire in the wiring mounting region; and forming a second conductive layer in the substrate, the second conductive layer including second wires disposed in the wiring mounting region, the second wires intersecting with the first wires, and a semiconductor pattern covering at least one intersectional region formed by a first wire and one or more second wires.

Optionally, the semiconductor pattern has a circular shape or an oval shape.

Optionally, the semiconductor pattern is between the first wire and at least one of the one or more second wires.

Optionally, along a direction the second wires are aligned, a cross-sectional width of a semiconductor pattern extends beyond a cross-sectional width of the first wire.

Optionally, along a direction the first wires are aligned, a cross-sectional width of a semiconductor pattern extends beyond a cross-sectional width of the second wire.

Optionally, along a direction the second wires are aligned, the cross-sectional width of a semiconductor pattern is smaller than a cross-sectional width of the first wire.

Optionally, along a direction the first wires are aligned, the cross-sectional width of a semiconductor pattern is smaller than a cross-sectional width of the second wire.

Another aspect of the present disclosure provides a display device, including one or more of the disclosed display substrates.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

It should be noted that, in the present disclosure, the terms "on", "over", "below", "under", and the alike are merely used to illustratively describe the positions or the positional relationship between objects in the drawings. The description of the disclosure may thus be simpler. These terms do not indicate or imply any specific positions or positional relationship of the objects in actual devices or apparatus, nor do these terms indicate or imply any specific operation to result the positions and the positional relationship. Therefore, these terms should not limit the scope of the present disclosure.

It should also be noted that, in the embodiments of the present disclosure, a "layer" refers to a film formed by a material using a deposition process or any suitable processes on another object, e.g., a substrate or another film. If a patterning process is performed on the film, the film after the patterning process is referred as a "layer". The "layer" after a patterning process includes at least a "pattern".

For example, a metal film can be formed by a deposition process. The metal film can then be patterned to form a source/drain metal layer. The source/drain metal layer includes a source and a drain. In this case, the source and the drain are patterns.

Further, a patterning process refers to a process for forming a layer with at least one pattern based on a film. Generally, a patterning process includes: coating a photoresist layer on a film, exposing the photoresist layer with a mask, stripping away portions of the photoresist layer that need to be removed using a suitable developer, etching away the portions of the film that are not covered by the photoresist layer, and removing the remaining portions of the photoresist layer. Accordingly, in the present disclosure, "a patterning process" refers to a process to form a desired layer structure after an exposure.

It should also be noted that, the terms "intersect", "intersecting", "intersection", "intersectional region", and the alike do not indicate any physical or electrical contact/connection. The terms are merely used to describe that the orthogonal projections of two or more objects on the substrate are not parallel. The orthogonal projections of the objects may intersect or overlap at certain locations.

The present disclosure provides a disclosed display substrate. The display substrate includes a semiconductor pattern disposed between a first wire and a second wire for reducing the capacitance in between. The semiconductor pattern may at least partially cover the intersectional region formed by the first wire and the second wire. The capacitance between the first wire and the second wire may be reduced, and interference to the signals transmitted in the first wire and the second wire may be reduced accordingly. Further, the second wire, formed on the semiconductor pattern, may undergo two elevations to cover the semiconductor pattern. The second wire may thus be easier to form. Further, the semiconductor pattern may have a circular shape or an oval shape, the edges of the semiconductor pattern may be sufficiently smooth that corona discharge may be reduced or eliminated.

It should be noted that, in the present disclosure, the term "cover an intersectional region" or the alike may be used to describe that the orthogonal projection of one object on the substrate covering the orthogonal projection of one intersectional region on the substrate. The term "cover" refers to the object partially covering or fully covering the intersectional region, depending on different embodiments and designs. In the present disclosure, unless specified otherwise, "the intersectional region" refers to the intersectional region of a first wire and a second wire in description.

One aspect of the present disclosure provides a display substrate.

Figure 3:
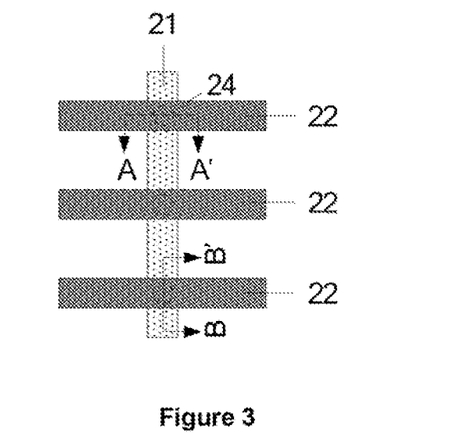
FIG. 3 illustrates a top view of a portion of a wiring mounting region of an exemplary display substrate according to various embodiments of the present disclosure.
Figure 4:
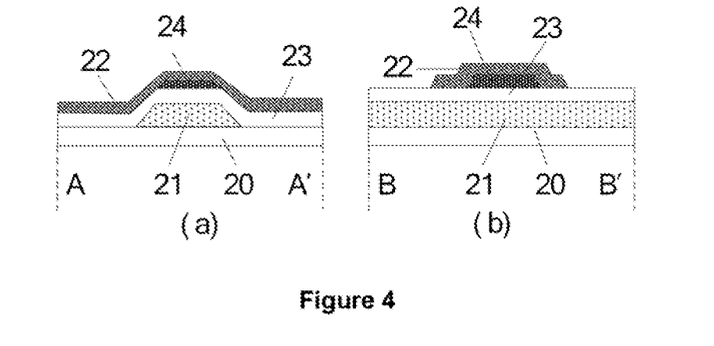
FIG. 4 illustrates cross-sectional views in (a) and (b) along A-A' direction and B-B' direction of the exemplary display substrate shown in FIG. 3.

As shown in FIGS. 3 and 4, the display substrate may include a substrate 20. The display substrate may also include a first conductive layer formed on the substrate 20, an insulating layer 23 formed on the first conductive layer, and a second conductive layer formed on the insulating layer 23. The first wires 21 may locate in the first conductive layer, and the second wires 22 may locate in the second conductive layer. The display substrate may be divided into a display region and a wiring mounting region, similar to the layout shown in FIG. 1. The first conductive layer may include the first wires 21 arranged in the wiring mounting region. The second conductive layer may include the second wires 22 arranged in the wiring mounting region. The first wires 21 and the second wires 22 may intersect with one another.

For example, FIG. 3 depicts the intersectional region of a first wire 21 and three second wires 22. The display substrate may further include a semiconductor layer disposed between the first conductive layer and the second conductive layer. The semiconductor layer may include at least a semiconductor pattern 24 located at the intersectional region of a first wire 21 and a second wire 22. For illustrative purposes, the present disclosure is illustrated having one first wire 21 intersecting with three second wires 22, as shown in FIGS. 3, 5, 7, 9, and 11, although any number of the first wires, any number of the second wires, and their combinations can be encompassed in the present disclosure.

It should be noted that, a semiconductor layer may be located between the first conductive layer and the second conductive layer, as shown in FIGS. 4, 6, 8, and 10. The semiconductor pattern 24 may be located between the insulating layer 23 and a second wire 22. In some other embodiments, the semiconductor pattern 24 may be located between the insulating layer 23 and a first wire 21. For illustrative purposes, the present disclosure uses the configuration shown in FIGS. 4, 6, 8, and 10 as examples. The first wire 21 and the second wires 22 may be various kinds of wires, used for different functions. The specific functions of the wires and the connections between wires should not be limited by the embodiments of the present disclosure.

In the wiring mounting region of the disclosed display substrate, a semiconductor pattern may be disposed between a first wire and a second wire. The first wire and the semiconductor pattern may form a first capacitance. The second wire and the semiconductor pattern may form a second capacitance. The first capacitance and the second capacitance may be connected in series. The total capacitance of the connected first capacitance and the second capacitance may be smaller than the total capacitance formed by the first wire and the second wire without having the semiconductor pattern. Thus, signal interference caused by the capacitance formed by the first wire and the second wire may be reduced.

It should be noted that, the display region of the display substrate may also include display components. For example, the display components may include one or more of an organic light-emitting diode (OLED) display component, a liquid crystal display (LCD) component, a microcapsule display component, and so on. For example, an OLED display component often includes an array substrate and a packaging substrate. OLED arrays and the wiring mounting region are formed on the array substrate, and FPCs are connected with the array substrate. In another example, an LCD component often includes an array substrate and a color filter substrate. TFT arrays and the wiring mounting region are formed on the array substrate, and FPCs are connected with the array substrate. The disclosed display substrate may be used as the array substrate of an OLED display device or the array substrate of an LCD display device.

For a display device, the wiring mounting region is often connected to the FPCs to drive the circuits. The wiring mounting region may be formed on the array substrate or other substrates. In the present disclosure, the display substrate may include the wiring mounting region. The first wires and the second wires intersect in the wiring mounting region. The display substrate may be an array substrate, a packaging substrate, or other suitable substrates.

In some embodiments, as shown in FIGS. 3, 5, 7, and 9, indicated by the dashed circles, the top view of the semiconductor pattern may have a circular shape or an oval shape. The edges of a semiconductor pattern may be sufficiently smooth so that corona discharge at sharp edges can be reduced or eliminated.

In some embodiments, the first conductive layer may also include the gate lines formed in the display region, the second conductive layer may also include the data lines formed in the display region, and the semiconductor layer may also include the active layers formed in the display region. That is, the gate lines and the first wires may be formed through a same, single patterning step. The data lines and the second wires may be formed through a same, single patterning step. The semiconductor pattern and the active layers may be formed through a same, single patterning process.

A gate insulating layer may be disposed between a gate line and the corresponding active layer. The gate insulating layer and the insulating layer in the wiring mounting region may be formed through a same fabrication step. Accordingly, a semiconductor pattern 24 may be disposed between an insulating layer 23 and a second wire 22. That is, in some embodiments, the semiconductor layer may be disposed between the insulating layer and the second conductive layer.

As shown in FIGS. 3 and 4(a), along the direction the second wires 22 are aligned, i.e., the A-A' direction, the cross-sectional width of the semiconductor pattern 24 may be smaller than the cross-sectional width of the first wire 21. That is, the semiconductor pattern may only cover a portion of the intersectional region formed by the first wire 21 and the second wire 22, and the remaining portion of the intersectional region may not be disposed or covered with the semiconductor pattern 24.

For the remaining portion of the intersectional region not covered with the semiconductor pattern 24, the capacitance formed by the first wire 21 and the second wire 21 may be undesirably high. In addition, because the first wire 21 can be considerably thick, when the second wire 22 is being formed, the portion of the second wire 22 formed at the intersectional region, covering the semiconductor pattern 24, may undergo one abrupt elevation to cover the semiconductor pattern 24. Specifically, as shown in FIG. 4(a), when the semiconductor pattern 24 covers only a portion of the intersectional region, the portion of the second wire 22 formed on the semiconductor pattern 24 may be considerably elevated than the portions of the second wire 22 formed on the insulating layer 23. As a result, it may be difficult to form the second wires 22.

Further, as shown in FIG. 3 and FIG. 4(b), along the direction the first wire 21 is aligned, i.e., the B-B' direction, the cross-sectional width of the semiconductor pattern 24 may be smaller than the cross-sectional width of the second wire 22. That is, the semiconductor pattern 24 may only cover a portion of the intersectional region, and the remaining portion of the intersectional region may not be covered by the semiconductor pattern 24. For the portion of the intersectional region not covered by the semiconductor pattern 24, the capacitance formed by the first wire 21 and the second wire 21 may be undesirably high.

Figure 5:
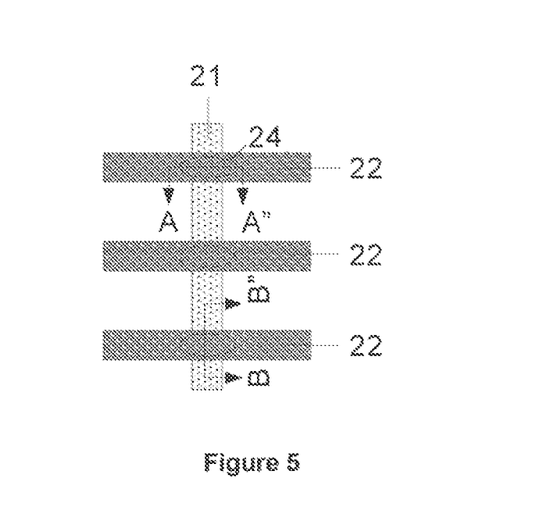
FIG. 5 illustrates a top view of a portion of a wiring mounting region of another exemplary display substrate according to various embodiments of the present disclosure.
Figure 6:
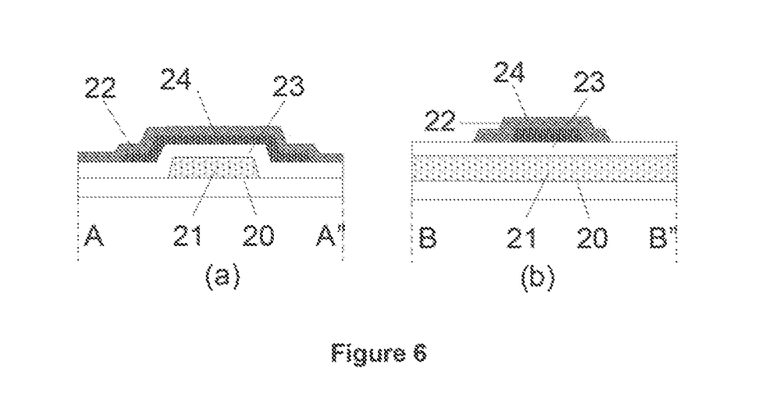
FIG. 6 illustrates cross-sectional views in (a) and (b) along A-A" direction and B-B" direction of the exemplary display substrate shown in FIG. 5.

To further reduce the capacitance formed by the first wire and the second wire, and reduce the fabrication difficulty, in some embodiments, as shown in FIG. 5, along the direction the second wires 22 are aligned, i.e., the A-A" direction, the cross-sectional width of the semiconductor pattern 24 may be wider than the cross-sectional width of the first wire 21. As shown in FIG. 6(a), along the A-A" direction, the cross-sectional width of the semiconductor pattern 24 may extend beyond the cross-sectional width of the first wire 21. That is, the semiconductor pattern 24 may fully cover the intersectional region of the first wire 21 and a second wire 22. The capacitance formed by the first wire 21 and the second wire 22 may be reduced.

Further, compared to FIG. 4(a), the second wire 22 formed in FIG. 6(a) may undergo two elevations to be formed on the semiconductor pattern 24. Because each elevation is smaller than the one abrupt elevation described in FIG. 4(a), the formation of the second wire 22 shown in FIGS. 3, 4(a), and 4(b) may be easier. As shown in FIGS. 5 and 6(b), along the direction the first wire 21 is aligned, i.e., the B-B" direction, the semiconductor pattern 24 may only cover a portion of the intersectional region, and the remaining portion of the intersectional region may not be covered with the semiconductor pattern 24. For the portions of the section not disposed with the semiconductor pattern 24, the capacitance formed by the first wire 21 and the second wire 22 may be undesirably high.

Figure 7:
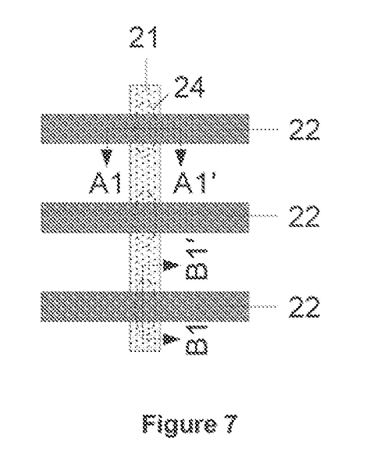
FIG. 7 illustrates a top view of a portion of a wiring mounting region of another exemplary display substrate according to various embodiments of the present disclosure.
Figure 8:
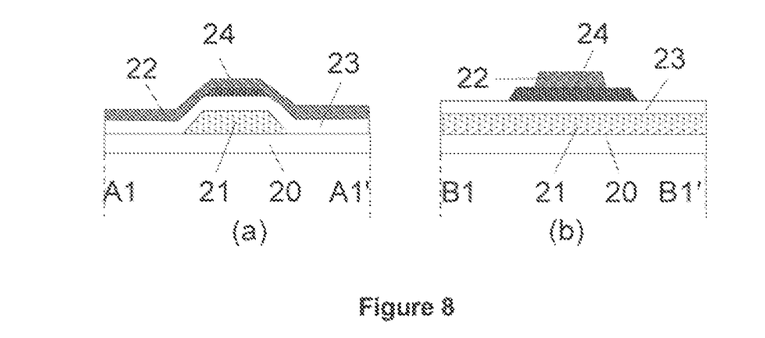
FIG. 8 illustrates cross-sectional views in (a) and (b) along A1-A1" direction and B1-B1" direction of the exemplary display substrate shown in FIG. 7.

Further, in some other embodiments, as shown in FIG. 7, along the direction the first wire 21 is aligned, i.e., the B1-B1" direction, the cross-sectional width of the semiconductor pattern 24 may be wider than the cross-sectional width of the second wire 22. As shown in FIG. 8(b), along the B1-B1" direction, the cross-sectional width of the semiconductor pattern 24 may extend beyond the cross-sectional width of the second wire 22. That is, the semiconductor pattern 24 may fully cover the intersectional region formed by the first wire 21 and a second wire 22. The capacitance formed by the first wire 21 and the second wire 22 may be reduced.

However, as shown in FIG. 7, along the direction the second wires 22 are aligned, i.e., the A1-A1' direction, the semiconductor pattern 24 may only cover a portion of the intersectional region. As shown in FIG. 8(a), the semiconductor pattern 24 may only cover a portion of the intersectional region formed by the first wire 21 and a second wire 22. For the portion of the intersectional region not covered by the semiconductor pattern 24, the capacitance formed by the first wire 21 and the second wire 22 may be undesirably high. In addition, because the first wire 21 can be considerably thick, when the second wire 22 is being formed, the portion of the second wire 22 formed at the intersectional region, covering the semiconductor pattern 24, may undergo one abrupt elevation to be formed on the semiconductor pattern 24. Specifically, as shown in FIG. 8(a), when the semiconductor pattern 24 covers only a portion of the intersectional region, the portion of the second wire 22 formed on the semiconductor pattern 24 may be considerably elevated than the portions of the second wire 22 formed on the insulating layer 23. As a result, it may be difficult to form the second wires 22.

Figure 10:
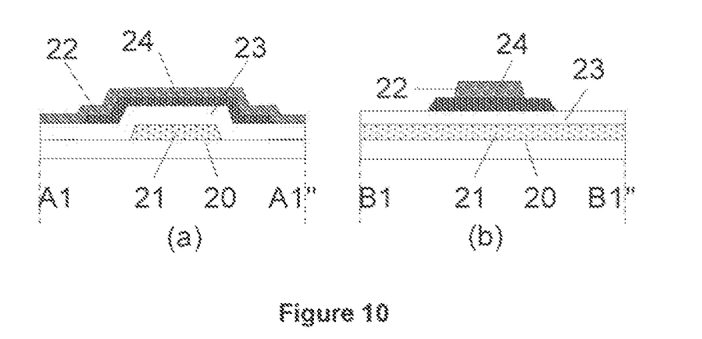
FIG. 10 illustrates cross-sectional views in (a) and (b) along A1-A1" direction and B1-B1" direction of the exemplary display substrate shown in FIG. 9.

Further, in some other embodiments, along the direction the second wires 22 are aligned, i.e., the A1-A1" direction, the cross-sectional width of the semiconductor pattern 24 may be wider than the cross-sectional width of the first wire 21. As shown in FIG. 10(a), along the A1-A1" direction, the cross-sectional width of the semiconductor pattern 24 may extend beyond the cross-sectional width of the first wire 21. That is, the semiconductor pattern 24 may fully cover the intersectional region formed by the first wire 21 and a second wire 22. The capacitance formed by the first wire 21 and the second wire 22 may be reduced.

Figure 9:
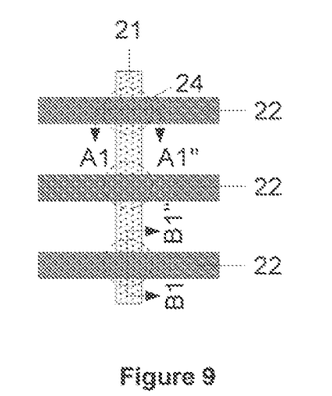
FIG. 9 illustrates a top view of a portion of a wiring mounting region of another exemplary display substrate according to various embodiments of the present disclosure.

Further, compared with FIG. 4(a), the second wire 22 formed in FIG. 10(a) may undergo two elevations to be formed on the semiconductor pattern 24. Because each elevation is smaller than the one abrupt elevation illustrated in FIG. 10(a), the second wire 22 shown in FIGS. 9, 10(a) and 10(b) can be easier to form. As shown in FIGS. 9 and 10(b), along the direction the first wire 21 is aligned, i.e., the B1-B1" direction, the cross-sectional width of the semiconductor pattern 24 may extend beyond the cross-sectional width of the second wire 22. That is, the semiconductor pattern 24 may fully cover the intersectional region formed by the first wire 21 and the second wire 22. The capacitance formed by the first wire 21 and the second wire 22 may be reduced.

In some embodiments, if the semiconductor pattern 24 has a circular shape, the semiconductor pattern 24 may have a structure shown in FIGS. 3 and 4. The semiconductor pattern 24 may only cover a portion of the intersectional region formed by the first wire 21 and a second wire 22. The cross-sectional width of the semiconductor pattern 24 may be smaller than the cross-sectional width of the first wire 21 along the A-A' direction, and may be smaller than the cross-sectional width of the second wire 22 along the B-B' direction. The center of the intersectional region, formed by the first wire 21 and the second wire 22, may be the center of the semiconductor pattern 24. In some other embodiments, if the semiconductor pattern 24 has a circular shape, the semiconductor pattern 24 may have a structure shown in FIGS. 9 and 10. The cross-sectional width of the semiconductor pattern 24 may extend beyond the cross-sectional width of the first wire 21 along the A1-A1" direction. The cross-sectional width of the semiconductor pattern 24 may extend beyond the cross-sectional width of the second wire 22 along the B1-B1" direction. The center of the intersectional region, formed by the first wire 21 and the second wire 22, may be the center of the semiconductor pattern 24.

In some embodiments, as shown in FIGS. 5 and 6, if the semiconductor pattern 24 has an oval shape, the cross-sectional width of the semiconductor pattern 24 may extend beyond the cross-sectional width of the first wire 21 along the major axis of the oval, i.e., along the A-A" direction, and the cross-sectional width of the semiconductor pattern 24 may be smaller than the cross-sectional width of the second wire 22 along the minor axis of the oval, i.e., along the B-B" direction. The center of intersectional region, formed by the first wire 21 and a second wire 22, may be the intersectional region of the major axis and the minor axis of the oval.

In some other embodiments, as shown in FIGS. 7 and 8, if the semiconductor pattern 24 has an oval shape, the cross-sectional width of the semiconductor pattern 24 may extend beyond the cross-sectional width of the second wire 22 along the major axis, of the oval, i.e., the B1-B1" direction, and the cross-sectional width of the semiconductor pattern 24 may be smaller than the cross-sectional width of the first wire 22 along the minor axis of the oval, i.e., the A1-A1" direction. The center of intersectional region, formed by the first wire 21 and the second wire 22, may be the intersectional region of the major axis and the minor axis of the oval.

Figure 11:
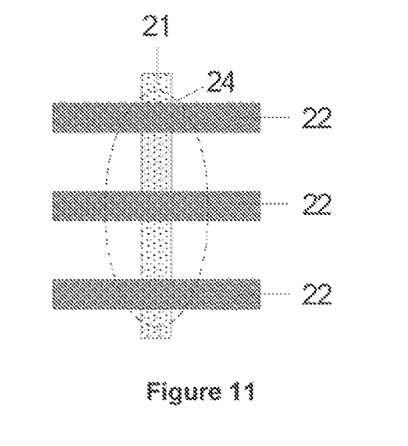
FIG. 11 illustrates a top view of a portion of a wiring mounting region of another exemplary display substrate according to various embodiments of the present disclosure.

It should be noted that, as shown in FIG. 11, in certain embodiments, if the semiconductor pattern has an oval shape, the cross-sectional width of the semiconductor pattern 24 may extend beyond the cross-sectional width of the second wire 22 along the minor axis of the oval, and the cross-sectional width of the semiconductor pattern 24 may extend beyond the cross-sectional width of the first wire 21 along the major axis of the oval. In FIG. 11, the minor axis of the oval may be along the direction the second wires 22 are aligned, and the major axis of the oval may be along the direction the first wire 21 is aligned.

Further, as shown in FIG. 11, a semiconductor pattern 24 may cover or correspond to a plurality of intersectional regions formed by a first wire 21 and a plurality of second wires 22. For example, in FIG. 11, a first wire 21 may intersect with three second wires 22, and the semiconductor pattern 24 may correspond to three intersectional regions formed by the first wire 21 and the second wires 22. Referring to the semiconductor pattern described earlier, e.g., in FIGS. 9 and 10, the second wires 22 may undergo two elevations along the direction the second wires 22 are aligned. Thus, the second wires 22 may be easier to form.

Figure 12:
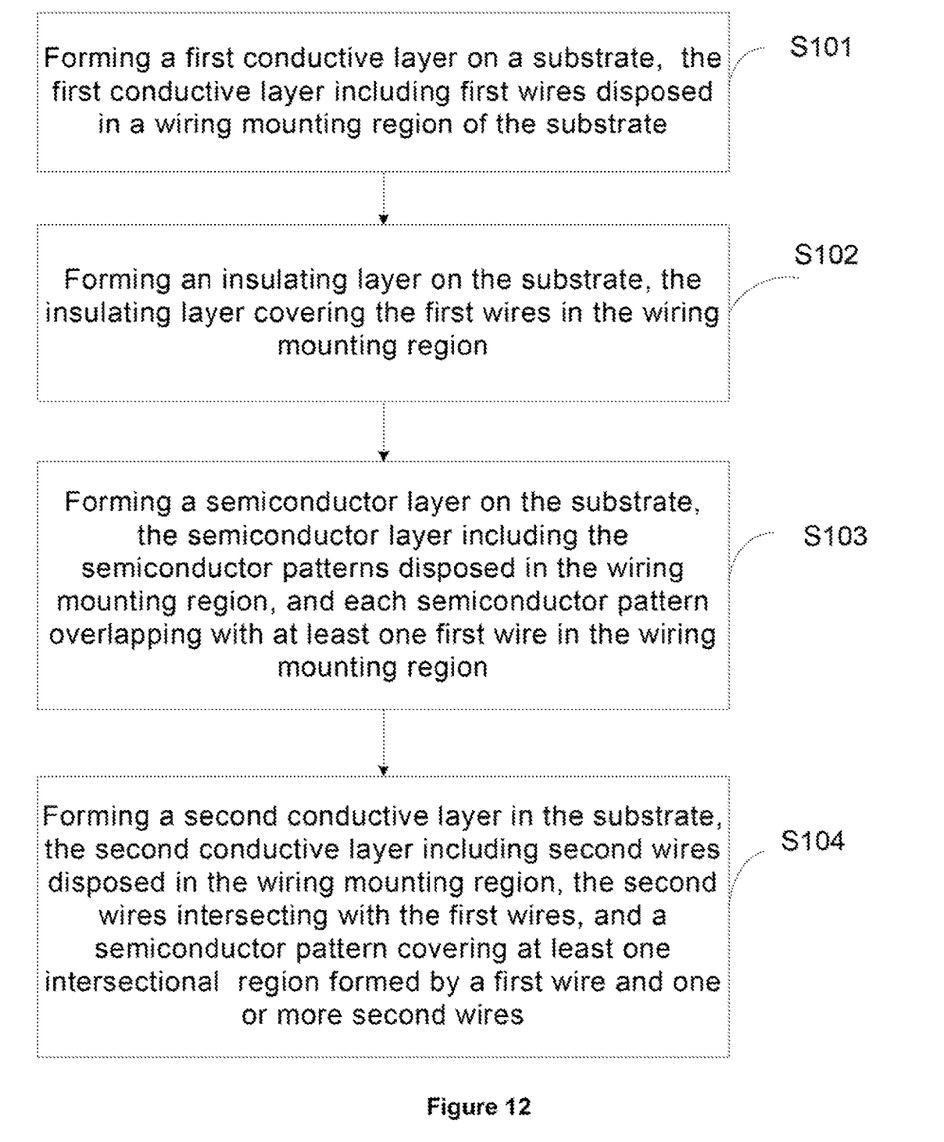
FIG. 12 illustrates a process flow of an exemplary method for fabricating a display substrate according to various disclosed embodiments of the present disclosure.

Another aspect of the present disclosure provides a method for fabricating a display substrate. FIG. 12 illustrates an exemplary process flow of the disclosed method.

In step S101, a first conductive layer may be formed on a substrate. The first conductive layer may include first wires disposed in a wiring mounting region of the substrate.

Specifically, a suitable conductive thin film, e.g., a metal thin film, may be formed on the substrate. A suitable patterning process, e.g., an etching process, may be used to form the first wires in the wiring mounting region.

In step S102, an insulating layer may be formed on the substrate. The insulating layer may cover the first wires in the wiring mounting region. The insulating layer may be formed through a suitable deposition process or a suitable coating process. The insulating layer may be made of an electrically insulating material.

In step S103, a semiconductor layer may be formed over the substrate. The semiconductor layer may include the semiconductor patterns disposed in the wiring mounting region. Each semiconductor pattern may overlap with at least one first wire in the wiring mounting region.

Specifically, a semiconductor thin film may be formed on the substrate. A suitable patterning process, e.g., an etching process, may be used to form the semiconductor patterns in the wiring mounting region.

In step S104, a second conductive layer may be formed over the substrate. The second conductive layer may include second wires disposed in the wiring mounting region. The second wires may intersect with the first wires. A semiconductor pattern may cover at least one intersectional region formed by one or more first wires and second wires.

Specifically, a suitable conductive thin film, e.g., a metal thin film, may be formed on the substrate. A suitable patterning process, e.g., an etching process, may be used to form the second wires in the wiring mounting region.

It should be noted that, the fabrication of the display substrate should not be limited to the specific steps or orders described above. For example, step S102 and step S103 may switch such that step S103 may performed before step S102. The fabrication of the display components included in the display region of the display substrate is known to those skilled in the art and is not repeated herein.

In some embodiments, the first conductive layer may further include gate lines formed in the display region of the display substrate, the second conductive layer may further include data lines formed in the display region of the display substrate, the semiconductor layer may further include active layers in the display region of the display substrate, and the insulating layer may further cover the gate lines in the display region. That is, the gate lines and the first wires may be formed through one single patterning process, the data lines and the second wires may be formed through one single patterning process, and the active layers and the semiconductor patterns may be formed through one single patterning process. A gate insulating layer may be disposed between a gate line and a corresponding active layer. The gate insulating layer may be formed through a same, single fabrication step with the insulating layer in the wiring mounting region. That is, the insulating layer may cover the gate lines in the display region of the display substrate.

Another aspect of the present disclosure provides a display device. The display device may include one or more of the above-mentioned display substrates. In some embodiments, the display device may be a display apparatus. The display device according to the embodiments of the present disclosure can be used in any suitable device with display functions such as an LCD device, an electronic paper, an OLED display device, and parts or products incorporating these devices, such as a television, a digital camera, a digital photo frame, a mobile phone and a tablet computer.

According to the present disclosure, in the disclosed display substrate, a semiconductor pattern is disposed between a first wire and a second wire for reducing the capacitance there-between. The semiconductor pattern may at least partially cover the intersectional region formed by the first wire and the second wire. The capacitance between the first wire and the second wire may be reduced. Further, the second wire, formed on the semiconductor pattern, may undergo two elevations to cover the semiconductor pattern. The second wire may thus be easier to form. Further, the semiconductor pattern may have a circular shape or an oval shape, the edges of the semiconductor pattern may be sufficiently smooth such that corona discharge may be reduced or eliminated.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. A display substrate, comprising:
 a display region; and
 a wiring mounting region surrounding the display region, the wiring mounting region comprising:
  a first wire and second wires, the first wire intersecting with one or more of the second wires, thereby defining one or more intersectional regions each continuously crossing an entire width of the first wire; and
  a semiconductor pattern between the first wire and the one or more of the second wires, a center of the semiconductor pattern coinciding with a center of one of the one or more intersectional regions, and the center of the semiconductor pattern being at an intersection of a first axis along the first wire and a second axis along one of the one or more of the second wires.

2. The display substrate according to claim 1, wherein the semiconductor pattern is between the first wire and each of the one or more of the second wires.

3. The display substrate according to claim 1, wherein the semiconductor pattern is between the first wire and a number of second wires.

4. The display substrate according to claim 1, wherein:
along a direction the second wires are aligned, a cross-sectional width of the semiconductor pattern extends beyond a cross-sectional width of the first wire.

5. The display substrate according to claim 1, wherein:
along a direction the first wire is aligned, a cross-sectional width of the semiconductor pattern extends beyond a cross-sectional width of the one or more of the second wires.

6. The display substrate according to claim 5, wherein:
along a direction the second wires are aligned, the cross-sectional width of the semiconductor pattern is smaller than a cross-sectional width of the first wire.

7. The display substrate according to claim 4, wherein:
along a direction the first wire is aligned, the cross-sectional width of the semiconductor pattern is smaller than a cross-sectional width of the one or more of the second wires.

8. The display substrate according to claim 1, further comprising:
a first conductive layer,
a second conductive layer,
an insulating layer between the first conductive layer and the second conductive layer, and
a semiconductor layer between the first conductive layer and the second conductive layer,
wherein:
the first conductive layer includes the first wire in the wiring mounting region;
the second conductive layer includes the second wires in the wiring mounting region; and
the semiconductor layer includes the semiconductor pattern in the wiring mounting region.

9. The display substrate according to claim 8, wherein the semiconductor pattern is between the insulating layer and the second conductive layer.

10. The display substrate according to claim 8, wherein:
the first conductive layer further includes gate lines in the display region;
the second conductive layer further includes data lines in the display region; and
the semiconductor layer further includes active layers in the display region.

11. A method for forming a display substrate, comprising:
forming a first conductive layer on a substrate having a display region and a wiring mounting region surrounding the display region, the first conductive layer including a first wire disposed in the wiring mounting region;
forming an insulating layer on the substrate, the insulating layer covering the first wire in the wiring mounting region;
forming a semiconductor layer on the substrate, the semiconductor layer including a semiconductor pattern disposed in the wiring mounting region and overlapping with the first wire in the wiring mounting region; and
forming a second conductive layer in the substrate, the second conductive layer including second wires disposed in the wiring mounting region, one or more of the second wires intersecting with the first wire, thereby defining one or more intersectional regions each continuously crossing an entire width of the first wire;
wherein a center of the semiconductor pattern coincides with a center of one of the one or more intersectional regions, the center of the semiconductor pattern being at an intersection of a first axis along the first wire and a second axis along one of the one or more of the second wires.

12. The method according to claim 11, wherein the semiconductor pattern is between the first wire and at least one of the one or more of the second wires.

13. The method according to claim 11, wherein:
along a direction the second wires are aligned, a cross-sectional width of the semiconductor pattern extends beyond a cross-sectional width of the first wire.

14. The method according to claim 11, wherein:
along a direction the first wire is aligned, a cross-sectional width of the semiconductor pattern extends beyond a cross-sectional width of the one or more of the second wires.

15. The method according to claim 14, wherein:
along a direction the second wires are aligned, a cross-sectional width of the semiconductor pattern is smaller than a cross-sectional width of the first wire.

16. The method according to claim 13, wherein:
along a direction the first wire is aligned, a cross-sectional width of the semiconductor pattern is smaller than a cross-sectional width of the one or more of the second wires.

17. A display device, including one or more of the display substrates according to claim 1.

18. The display substrate according to claim 1, wherein and the first wire and the one or more of the second wires each extend in opposite directions beyond an area covered by the semiconductor pattern.

* * * * *